United States Patent [19] [11] 3,800,230
Marks et al. [45] Mar. 26, 1974

[54] DIGITAL PROGRAMMER FOR RECEIVERS

[75] Inventors: Hillard W. Marks, Chicago, Ill.; John P. Molis, Los Angeles, Calif.

[73] Assignee: Marks Brothers Productions, Inc., Culver City, Calif.

[22] Filed: Aug. 14, 1972

[21] Appl. No.: 280,424

[52] U.S. Cl. .................. 325/396, 325/465, 325/470
[51] Int. Cl. ......................... G11b 31/00, H04b 1/06
[58] Field of Search .................... 325/396, 465, 470; 340/172.5

[56] References Cited

UNITED STATES PATENTS

| | | | |
|---|---|---|---|
| 3,201,572 | 8/1965 | Yetter | 235/151 |
| 3,518,586 | 6/1970 | Nilssen et al. | 334/7 |
| 3,529,175 | 9/1970 | Feingold | 307/141.8 |
| 3,584,203 | 6/1971 | Patselt et al. | 235/151.1 |
| 3,654,557 | 4/1972 | Sakamoto et al. | 325/465 |
| 3,681,541 | 12/1972 | Dozier et al. | 179/100.11 |

*Primary Examiner*—Paul J. Henon
*Assistant Examiner*—Michael Sachs
*Attorney, Agent, or Firm*—Edwin A. Oser

[57] ABSTRACT

A digital programmer for selecting one of a plurality of stations to be received by an electromagnetic wave receiver at a desired time. The programmer includes a digital clock, and a digital time comparator for each station or channel to be selected. The comparator will compare the preset time to the actual time received from the clock. Further, there is provided a selected channel memory for each station. The channel memory will generate a channel signal of the selected channel at the preset time. This channel signal is steered by a channel steering network into a channel comparator where it is compared to the actual station being tuned in. The tuner of the receiver is then energized to change stations or channels until the desired station has been tuned in.

8 Claims, 6 Drawing Figures

PATENTED MAR 26 1974 3,800,230

SHEET 1 OF 3

DIGITAL PROGRAMMER FOR RECEIVERS

BACKGROUND OF THE INVENTION

This invention relates generally to a programmer for electromagnetic wave receivers, and particularly relates to a digital programmer for selecting a desired station or channel at a preset time over an extended period of time.

Clock radio receivers and programmers for the tuners of television receivers are well known in the art. However, prior programmers are generally characterized by mechanical equipment such, for example, as a rotating shaft controlled by the clock and provided with cams or switches. Thus, prior programmers are characterized by the use of mechanical devices and analog voltages for controlling the tuner of the broadcast receiver which may either be a radio receiver or a television receiver. The tuner in turn may be operated by an electric motor which is generally the case for a television receiver. Alternatively a variable capacitance diode may be used for varying the resonant frequency of one or more circuits for controlling the local oscillator of the radio receiver or the like.

The disadvantage of such prior art clock radios or motorcontrolled programmers is their bulk and expense. Furthermore, most of them require extensive changes of the broadcast receiver so that they cannot readily be installed in an existing broadcast receiver without substantial changes.

It is accordingly an object of the present invention to provide a programmer for an electromagnetic wave receiver such, for example, as a television receiver which makes use of digital logic.

A further object of the present invention is to provide a digital programmer which may inexpensively be manufactured and which by the nature of the electronics permits faster and more reliable operation.

Another object of the present invention is to provide a digital programmer of the type discussed which may inexpensively be manufactured with silicon metal-oxide semiconductor technology employing large-scale integrated circuits and which permits selection of any desired station at any time during a day as well as changes of the preset program when desired.

SUMMARY OF THE INVENTION

In accordance with the present invention there is provided a digital programmer for an electromagnetic wave receiver. Such a receiver may be a radio or a television receiver. For convenience the invention will be described in connection with the tuning of a television receiver, but it is to be understood that the programmer of the invention is also applicable to any other electromagnetic wave receiver.

The programmer operates on the tuner of the television receiver. The tuner may be either mechanically tunable by rotation thereof or else it may be electronically controllable by varying the reactance such as the capacitance or inductance of a resonant circuit forming part of the tuner.

The programmer includes a digital clock which generates digital signals indicating the real time. This time signal is impressed on a plurality of digital time comparators, there being one for each station or channel to be selected. Upon coincidence of the real time signal with the desired time a signal will be generated which is routed by a signal steering network to tune the tuner of the receiver.

Furthermore, there is a channel memory for each channel to be selected. The corresponding channel signal is passed by the signal steering network to a channel signal comparator upon occurrence of the selected time signal.

The channel signal comparator then compares the selected channel with the channel being tuned by the tuner of the receiver. The tuner is now varied until it is tuned to the desired station. This continues until the next selected time for another channel approaches; then the operation repeats.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings.

DESCRIPTION OF THE PREFERRED EMBODIMENT

Figures 1, 3:
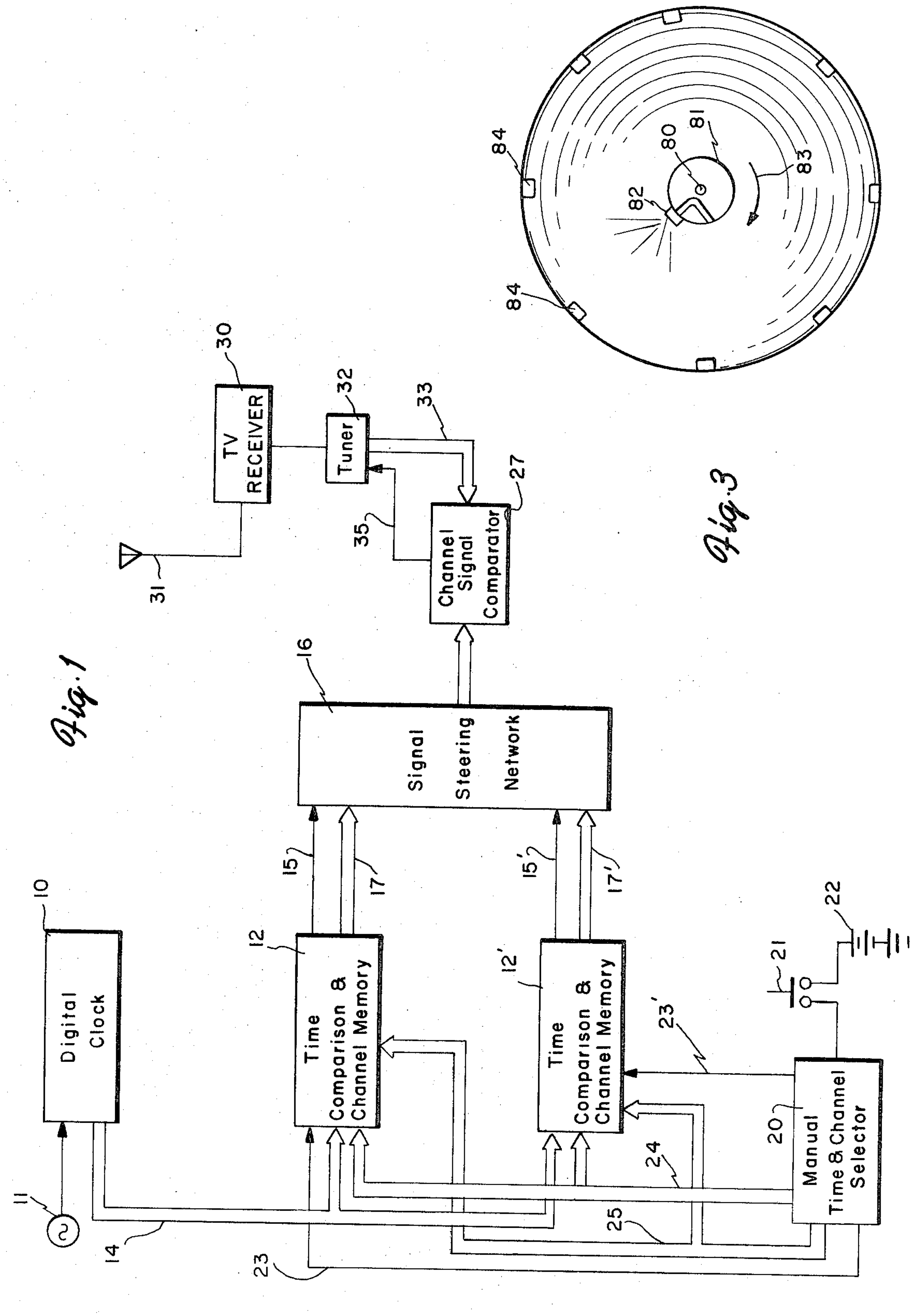
FIG. 1 is a simplified block diagram of the digital programmer of the invention and illustrating a television receiver and tuner.
FIG. 3 is a side-elevational view of a television tuner having means for sensing or detecting the particular channel to which it is tuned.

Referring now to the drawings and particularly to FIG. 1 there is illustrated a simplified block diagram of the digital programmer of the invention. As pointed out before, the programmer of the invention is adapted to operate with any electromagnetic wave receiver such as an AM or FM radio receiver. However, it has been shown in the drawings in connection with a television receiver. Its purpose is to preselect according to a schedule a series of stations or channels over a period of time such as a day. This selection of channels may be changed at any time by the operator to change a particular station at some time, or else the entire schedule. Thus, when the selected time arrives the tuner of the receiver will be tuned, for example, by varying its tuning parameters, thereby to change stations until the selected station has been tuned in.

Accordingly, the programmer of the invention includes a digital clock 10 which may be energized by an alternating current source 11 as shown. The digital clock 10 may or may not be adapted to show the time, for example, by numerals. Preferably, however, it does include a register which will hold the digital information, that is binary bits or the like which may indicate, for example, the hours and minutes. Thus, assuming that it is desired to select stations over a full day it is ncessary to store four decimal numbers, that is two for the hours and two for the minutes. It may not be desired or necessary to time the change of stations for any unit of time less than a minute although this could readily be done. This may be effected by any conventional binary-coded decimal number system or by a straight binary code.

The programmer now includes a plurality of time comparison and channel memories shown at 12, 12'. It will be understood that there are n such time comparison and channel memories, where n is the total number of channels or stations to be selected. Each time comparison and channel memory includes a digital time comparator. The time comparator is coupled by a plurality of leads as shown by the double lines 14 to the digital clock 10 for the purpose of comparing the preselected time with the actual time received from the digital clock 10. Furthermore, each of the blocks 12 includes a selected channel memory where a particular channel may be selected for a particular time.

Upon occurrence of the selected time and enable signal which may be termed T1 is fed by a lead 15 to a signal steering network 16. A similar lead 15' connects another time comparison block 12' to the signal steering network 16. Furthermore, the selected channel memory signal which may be called CS1 is fed by a plurality of leads indicated at 17 to the signal steering network. A similar signal such as CSN is applied by the lead 17' from the channel memory 12' to the signal steering network 16. Only a particular one of the selected time signals is passed by the signal steering network 16.

The various time comparison and channel memories 12 are set by a manual time and channel selector 20. This may actually consist of a selected channel entry switch and a selected time entry switch. For example, the channel and time entry switches may consist of any one of several commercially available switches that are capable of converting any decimal number visible on the face of the switch and representing the channel or time selection, into a binary number corresponding to the selected channel or time. There may also be provided a storage register for storing the channel and time selections. After the selection has been effected a push button 21 is depressed or energized thereby to apply a positive voltage from a potential source such as a battery 22 to the selector 20 which now enables the selector to feed the generated signal into the selected time comparison and channel memories 12. Thus, as shown by the leads 23 and 23', the selected time and channel enable signals are applied to the respective boxes 12 and 12'. Similarly, time selection and channel selection signals are fed by a plurality of leads indicated at 24 and 25 respectively into the various boxes 12, 12' and so forth.

Thus, by operating the switches of the manual time and channel selector 20 and thereafter depressing the enable button 21 the selection of a particular channel at a particular time may be carried out. As will be more fully explained hereinafter, this selection process may be carried out in a sequential fashion. In other words, the channels may be selected with their respective times in a predetermined sequence channel after channel.

Assuming now that the time has arrived for a particular channel to be selected. Accordingly, the signal steering network 16 will simply pass the signal corresponding to the selected channel into a channel signal comparator 27. The channel signal comparator compares the actual station being tuned to the desired station. Thus, the television receiver 20, which may have an antenna 31, is provided with a tuner 32. It will, of course, be understood that the tuner 32 normally forms part of the television receiver, but has been shown separately in FIG. 1 for purposes of illustration. The tuner 32 is now connected by a plurality of leads 33 to the channel signal comparator 27. The leads serve the purpose to feed information to the channel signal comparator which indicates which station the set is tuned to.

As will be more fully explained hereinafter, this may include an encoder to translate or encode the actual station number or letter code into a binary code which is the one stored in the channel signal comparator 27. The channel signal comparator 27 generates an energizing signal 35 which is fed into the tuner 32 to cause the tuner to change stations. This will continue until the tuner is tuned to the desired station. This fact is reported back to the signal comparator 27 by the leads 33. Thereupon, the energizing signal fed by lead 35 into the tuner 32 is discontinued, because the television receiver is now tuned to the desired station.

The tuner 32 may, for example, include a stepper motor which is fed suitable stepping signals or pulses so as to move the motor stepwise from station to station. Alternatively, as pointed out before, the tuning process may be carried out entirely electronically, that is forming part of the resonant circuit of the local oscillator, for example, by an electronically variable reactance such as a capacitance.

From what has been said before, the operation of the programmer as shown in FIG. 1 will now be evident. For a more detailed description of the programmer reference is now made to FIG. 2.

Figure 2:
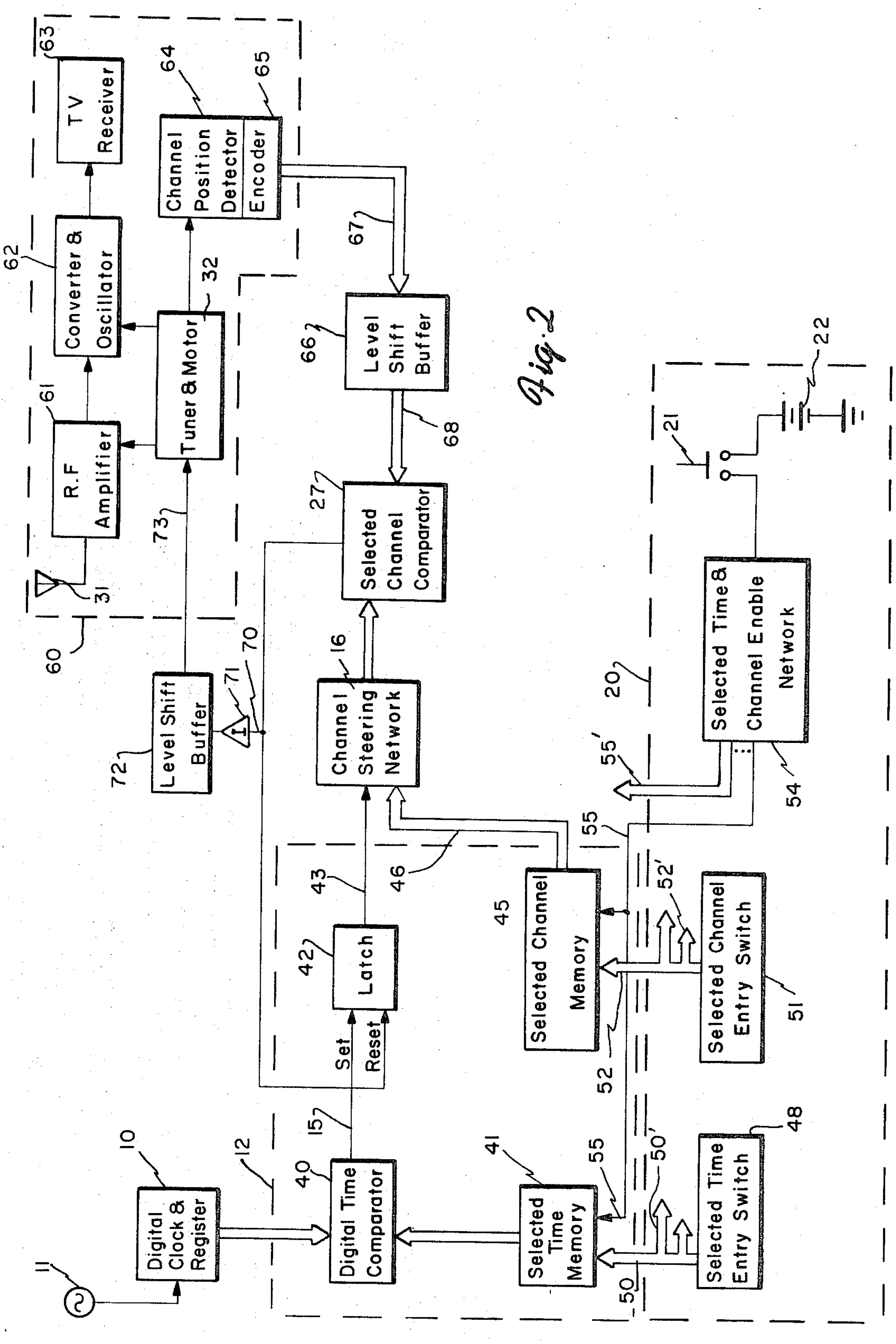
FIG. 2 is a detailed block diagram of the digital programmer and those parts of the receiver necessary for cooperation with the programmer of the invention.

As shown in FIG. 2, the programmer again includes a digital clock having a register 10. Only one of the time comparison and channel memories 12 is illustrated in FIG. 2 and enclosed in dotted lines. However, it will be understood that there is provided a plurality of such comparison and memory blocks, one for each station or channel to be selected. Thus, within the box 12, there is contained a digital time comparator 40 coupled to a selected time memory or register 41. The selected time memory 41 is to be manually set as will be explained hereinafter. Accordingly, the digital time comparator 40 compares the selected time memory obtained from the register 41 with the actual digital time obtained from the register of the digital clock 10.

Upon coincidence of the two time signals obtained from the registers 10 and 41, a signal will issue from the lead 15 into the set terminal of a latch 42 which also has a reset terminal. The latch 42 is simply a bistable multivibrator which can be set into the enable or logic 1 state or into the disable or logic 0 state by energizing its reset terminal. Therefore, the latch 42 has an output terminal which feeds a signal through the lead 43 into the channel steering network 16. It should be noted that the digital time comparator 40 has been shown in detail in FIG. 4 to which reference will subsequently be made.

There is also provided within the box 12 a selected channel memory 45 which may also be a register. The memory 45 is connected by a plurality of leads 46 to the channel steering network 16. The network 16 simply has the purpose of steering one of the selected channel signals through the network into the selected channel comparator 27 upon occurrence of the proper time coincidence signal obtained from lead 43. The details of the channel steering network 16 have been shown in FIG. 5 which will be subsequently described.

Before proceeding with the further operation of the programmer, it will now be convenient to explain how the information is impressed on the selected time memories 41 and the selected channel memories 45. Thus, there is provided a selected time entry switch 48 which is connected by a plurality of output leads 50 to the selected time memory 41. Other leads as shown at 50' will be connected to other selected time memories for other channels to be selected.

Similarly, there is a selected channel entry switch 51 which is connected by a plurality of leads 52 to the selected channel memory 45. Again, leads indicated at 52' will be connected to selected channel memories for other channels. As pointed out before, the entry switches 48 and 51 may, for example, be operated by push buttons or switches. However, neither the selected time signals nor the selected channel signals can be entered on the respective time memories 41 or channel memories 45 until the selected time and channel enable network 54 has generated the appropriate enable signal.

Figures 5, 6:
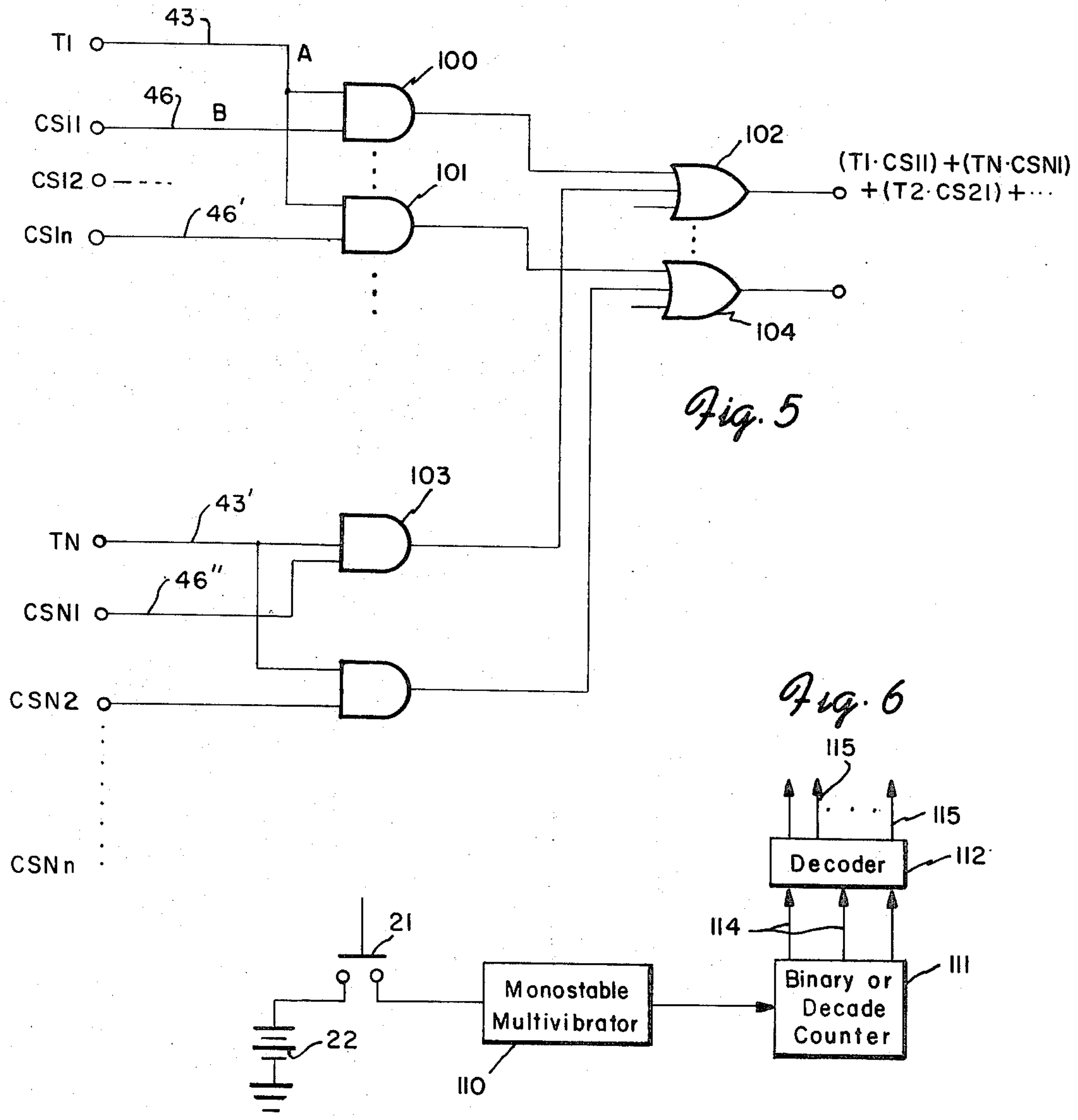
FIG. 5 is a logic network of the channel steering network included in the block diagram of FIG. 2.
FIG. 6 is a detailed block diagram of the selected time and channel enable network forming part of the block diagram of FIG. 2.

It should further be noted that FIG. 6 illustrates in some detail the structure of the network 54. As will be explained in connection with FIG. 6, the network 54 may be so constructed that the channels are selected sequentially by means of leads 55 and 55' in accordance with a predetermined sequence. Since the predetermined sequence is arbitrary and internal to the programmer, the operator need not know the sequence in order to enter the preselected times and channels. The selected time and channel enable network 54 may be energized as explained before by depressing the push button 21 which will apply a logic voltage to the network which may be applied by a battery 22. The enable signal is carried by a lead 55 to both the selected time memory 41 and the selected channel memory 45. Other leads such as shown in 55' are connected to other time and channel memories for other stations to be selected.

It may be mentioned that the digital programmer of the invention may be asynchronously operated. This means that there is no necessity for a clock or timing signal to time the respective digital operations. Thus, it will be evident that the time entry switch 48 and channel entry switch 51 may be manually operated whereupon the push button 21 is depressed. This will now enter the selected time and the selected channel into the proper box 12 by means of leads 55 or 55'. These boxes may be sequentially loaded for sequential selection of stations and times since each load signal is fed by leads 55 or 55' one at a time into each box 12.

Assuming now that the channel steering network 16 has impressed thereon the selected channel signal on the channel comparator 27. This will now set into operation the tuning procedure. As shown in FIG. 2, the dotted box 60 indicates the entire television receiver with tuner and including a channel position detector and encoder. Thus, the antenna 31 may be connected to a radio-frequency amplifier 61 which in turn is coupled to a converter and oscillator 62 and controlled by the tuner 32 which may include a motor. The remainder of the television receiver shown at 63 may include the usual intermediate-frequency amplifier, followed by a video and audio signal separator. The audio signal may be passed through an FM detector, audio amplifier and loudspeaker while the video signal is detected, amplified by a video amplifier and impressed on the control grid of a cathode ray tube. The electron beam may be deflected by the synchronizing signals recovered from the video signal.

Thus, as indicated the tuner 32 controls both the radio-frequency amplifier 61 and the oscillator included in the block 62. There is further provided a channel position detector 64 shown in more detail in FIG. 3, which will be subsequently described. The channel position detector may be followed by an encoder 65. The purpose of the encoder 65 is to generate a digital or binary signal corresponding to the actual channel position. This is the same binary signal which is impressed by the channel steering network 16 on the channel comparator 27. There may also be provided a level shift buffer 66 connected by a plurality of leads 67 to the encoder 65. The buffer 66 serves the purpose to convert the signal levels generated by the encoder 65 into a digital signal compatible with the programmer signal levels which may then be impressed by the leads 68 upon the selected channel comparator 27.

The output of the selected channel comparator 27 is obtained from output lead 70. This signal will be in its deenergized state until the desired channel has been tuned in. This deenergized signal state may be inverted by the inverter 71 and applied to another level shift buffer 72 which feeds an enable signal by means of a lead 73 into the tuner and motor 32. Accordingly, the tuner will keep on changing stations until the proper station has been reached. This will be detected by the channel position detector 64 and this detector signal properly encoded by the encoder 65 and buffered by the buffer 66 will reach the channel comparator 27 which will now generate an energized signal state indicating agreement between the selected channel and the tuned channel. This signal is inverted by the inverter 71 which applies it through buffer 72 to the tuner and motor 32 to turn off the motor.

At the same time the energized signal state obtained from the channel comparator 27 is applied through the lead 75 to the reset terminal of latch 42, thereby to disable the output terminal of the latch 42 so that the channel steering network 16 can no longer pass the channel signal and the entire operation stops.

This sequence of operation repeats itself as soon as the time has been reached for the next channel selection.

As explained hereinabove the tuner 32 has associated therewith a channel position detector 64. By way of example, such a channel position detector has been illustrated in FIG. 3 to which reference is now made. Thus, the shaft 80 of the tuner may be provided with a disk 81 on which is mounted a light source 82. This may, for example, consist of a light-emitting diode or the like. It will of course be understood that the disk 82 is keyed to the shaft 80 and rotates therewith as shown by the arrow 83. Disposed periphally about the disk 81 is a plurality of light sensing elements 84 which may, for example, consist of suitable photosensors. There will be as many photodetectors 84 as there are stations to be tuned. Accordingly, when the tuner has rotated to the proper position the light of the light source 82 is received by one of the photosensors 84. This signal is then fed into the encoder 65 which operates as previously described. It will of course be understood that the photodetectors 84 are stationary while the light source 82 rotates with the tuner.

Figure 4:
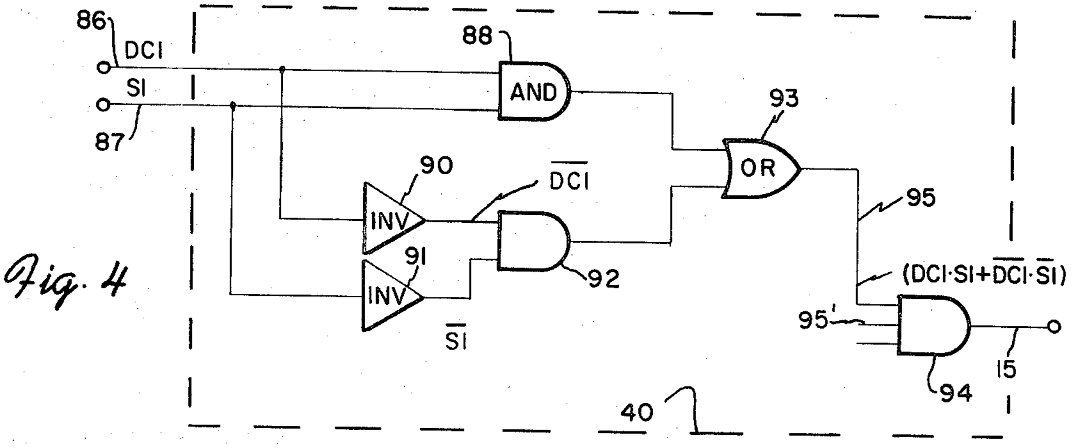
FIG. 4 is a logic network illustrating one of the digital time comparators of the block diagram of FIG. 2.

The network of which the digital time comparator 40 consists has been illustrated in FIG. 4. The network includes an input lead 86 connected to the digital clock and register 10. By means of lead 86 one of a plurality of bits may be compared to like bits impressed on lead 87 and received from the selected time memory 41. Like bits are compared in pairs in the digital time comparator 40 of FIG. 4. If all of the input bits from the digital clock 10 are identical to all the like input bits received from the selected time memory 41, the output lead 15 of the digital time comparator 40 will be enabled. By way of example, input lead 86 may carry a signal designated DC1. Similarly, on lead 87 will appear the selected time signal stored in memory 41 and this signal may be designated S1. Both of the leads 86 and 87 are connected to an AND circuit 88. At the same time the two signals from leads 86 and 87 are fed through separate inverter circuits 90 and 91 into another AND circuit 92. The outputs of the two AND circuits 88 and 92 are fed into an OR circuit 93 and thence into another AND circuit 94 having a plurality of input leads such as 95 and 95'. It will be understood that the other input leads of AND circuit 94 are connected to other logic gating networks similar to those shown in time comparator 40. The inputs to each group of logic gating networks represents the remaining like bit pairs from the digital clock 10 and the selected time memory 41 which comprise the digital time representation. Therefore, the input lead 95 of the AND circuit 94 will provide the following signal written in conventional Boolian algebraic terms:

(DC1 S1 + DC1 S1)

This term is ANDed with similar terms corresponding to other time and memory bits comprising the remainder of the time word.

Thus it will be seen that the digital time comparator 40 simply consists of AND and OR gates. The digital time comparator output signal obtained from output lead 15 is then impressed on the set input of the latch 42 thereby generating an enable signal on the latch output line 43.

The details of the channel steering network 16 are shown in FIG. 5 to which reference is now made. The input lead 43 from the latch 42 impresses a time signal say T1 on the circuit. At the same time the input lead 46 from the selected channel memory 45 impresses bit 1 of the selected channel signal which is CS11 on the circuit. As schematically indicated in FIG. 5 there are n such signal bits for each channel selection which may be designated CS11, CS12, . . . CSn, the last signal appearing on lead 46'. Accordingly, there are $2^n$ possible channel selections with an n bit binary channel selection word. Each of the n bits of the channel selection word are impressed on one input of the two inputs of *n* AND circuits such as 100 and 101. The other input of each of the AND circuits 100, 101 is connected to the lead 43 which supplies the T1 signal. This signal is used to enable the channel selection at the outputs of the AND circuits 100, 101 etc. The outputs of the AND circuits 100, 101 are connected in turn to one input of each of the n OR circuits 102, 104 etc.

It is to be understood that there are N groups each containing n AND gates. Each of the N groups corresponds to one of the time comparison and channel memory circuits such as 12, 12' of FIG. 1. Each of the N time comparison and channel memories can impress a channel selection word on the *n* OR gates by means of one and only one of the enable signals T1, ...... TN received from the leads 43, 43' etc.

The output signal for OR circuit 102 is as follows:

(T1 CS11) + (T2 CS21) + . . . (TN CSN1) . . .

It will be understood that there is a multiplicity of AND circuits such as 100, 101, 103 and OR circuits such as 102 and 104 which all feed into the selected channel comparator 27. Accordingly, upon time coincidence of the selected time with the real time the particular selected channel will be passed through the network of FIG. 5 into the selected channel comparator 27, thereby to initiate selection of a new channel.

The selected time and channel enable network 54 is illustrated in FIG. 6 to which reference is now made. It includes a monostable multivibrator 110 which is energized by depressing the push button 21 so as to apply a positive voltage thereto. The monostable multivibrator 110 has the purpose of generating a single logic level pulse, free of switch contact bounce transients, each time push button 21 is depressed. The monostable multivibrator 110 will generate an output signal which is fed into a binary or decade counter 111. The state of the counter 111 is advanced to the following state each time a signal is received from a monostable multivibrator 110. The counter 111 has the purpose of providing discrete binary or binary coded decimal state signals used for the sequential operation of loading channels and time selections into the selected time and channel memories 41 and 45 of FIG. 2. Accordingly, the output of the binary or decade counter 111 is fed into the decoder 112 by a plurality of leads 114. The decoder 112 then generates an output or enable signal on one and only one output lead of the plurality of output leads 115. Each of the leads 115 is then connected to one of the selected time memories 41 and one of the selected channel memories 45. Only the selected time and channel memory 12 or 12' of FIG. 1 receiving the single enable signal on one of the leads 115 will be loaded with the selected time signal from time entry switch 48 and the signal from the selected channel entry switch 51. Therefore, the respective stations may be selected one by one in accordance with the predetermined schedule of signals.

It will be understood that the respective gates, registers and the like of which the digital programmer consists may readily be manufactured by silicon metal-oxide semiconductor techniques or other large scale integrated circuit microminiaturization techniques. The entire programmer may be realized by one or a few circuit chips. This may have to be supplemented by a few push buttons and a tuning motor or some other tuning arrangement. The digital logic approach used in accordance with the present invention permits incorporation of a larger number of preset station selections at any time during the day than was practical with previously proposed mechanical approaches. In other words it is possible to add a large number of channel and time selections to the memory portion of a programmer 12 of FIG. 2. Such large memories have not been economically feasible in the past according to prior art suggestions.

It will also be realized that due to the digital nature of the control operation, changing channels can be accomplished substantially as fast as a tuner can be changed or rotated from station to station and the whole operation may require substantially less than a minute.

There has thus been disclosed a digital programmer for an electromagnetic wave receiver which preferably, but not necessarily, is a television receiver. The programmer may be arranged to store a daily schedule of stations which may be tuned in at desired times during the entire day. The preprogrammed schedule may readily and easily be changed at will to provide for a different schedule. The entire equipment makes use of digital techniques and is therefore reliable, fast and can be inexpensively manufactured. It is readily adaptable to any desired number of stations or channels.

What is claimed is:

1. A digital programmer for an electromagnetic wave receiver for selecting one of a plurality of channels to be tuned in at a predetermined time, said programmer comprising:

a. A digital clock for generating digital time signals and including a digital register for storing said time signals;

b. a plurality of digital time comparators for comparing a preset time with the time signals received from said digital register to develop a time coincidence signal, one time comparator for each channel to be selected;

c. a plurality of channel memories for storing a selected channel signal, one for each channel to be selected;

d. signal steering means coupled to said time comparators and said channel memories for passing a particular channel signal associated with a particular time coincidence signal and representative of the selected channel;

e. a channel signal comparator coupled to said steering network for comparing the actual channel of the receiver tuned in with the desired channel; and f. means for tuning channels until the desired channel has been tuned in

2. A digital programmer for a broadcast receiver for selecting one of a plurality of channels to be tuned in at a predetermined time, said programmer comprising:

a. a digital clock for generating digital time signals and including a digital register for storing said time signals;

b. at least one digital time comparator for comparing a preset time with the time signals received from said digital register and for generating a time coincidence signal;

c. a channel memory for storing a selected channel signal associated with a time signal;

d. a channel position detector for generating a tuned channel signal indicative of the channel to which the receiver is tuned;

e. a signal steering network coupled to said time comparator and said channel memory for passing the selected channel signal upon occurrence of the time coincidence signal for tuning said channel; and f. a channel signal comparator coupled to said steering network and to said channel position detector for comparing the selected channel signal to the tuned channel signal.

3. A digital programmer for an electromagnetic wave receiver having a tuner for selecting one of a plurality of channels at a predetermined time, said programmer comprising:

a. a digital clock for generating clock time signals and having a digital register for storing the clock time signals;

b. a time memory for storing a selected time signal;

c. a digital time comparator coupled to said digital register and said time memory for generating an output time signal in response to coincidence of the selected time signal with the clock time signal;

d. a channel memory for storing therein a selected channel signal associated with a time signal;

e. a channel steering network coupled to said time comparator and to said channel memory for passing the selected channel signal upon occurrence of said output time signal;

f. a channel position detector for generating a tuned channel signal indicative of the channel to which the receiver is tuned;

g. a channel comparator coupled to said channel position detector and to said channel steering network for generating an error signal when the selected channel signal and the tuned channel signal do not coincide;

h. means coupled to said channel comparator for energizing the tuner to change channels in response to said error signal until the receiver is tuned to the desired channel;

i. means for entering a selected time signal into said time memory; and j. means for entering a selected channel signal into said channel memory.

4. A digital programmer for a television receiver having a tuner for selecting one of a plurality of channels at a predetermined time, said programmer comprising:

a. a digital clock having a register for storing the digital time signals generated by said clock;

b. a plurality of time memories, one for each channel to be selected, each time memory storing a particular selected time signal;

c. a plurality of digital time comparators, each being coupled to said register and to one of said time memories for generating an output time signal in response to coincidence of the selected time signal with the digital time signal;

d. a plurality of channel memories, one for each channel to be selected, each channel memory storing therein a selected channel signal representative of a particular channel and associated with a selected time;

e. a channel steering network coupled to said time comparators and to said channel memories for passing the selected channel signal upon occurrence of said time signal;

f. a channel position detector for generating a tuned channel signal indicative of the channel to which the receiver is tuned;

g. a channel comparator coupled to said channel position detector and to said channel steering network for generating an error signal when the selected channel signal and the tuned channel signal do not coincide;

h. means coupled to said channel comparator for energizing the tuner to change channels until said error signal disappears;

i. means coupled to said time memories for entering a selected time into one of said time memories; and j. means coupled to said channel memories for entering a selected channel into the channel memory associated with said one of said time memories.

5. In combination with a television receiver, a digital programmer for selecting one of a plurality of channels at a desired time, said combination comprising:

a. a local oscillator included in said television receiver;

b. a tuner for said local oscillator and including means for operating said tuner to vary the resonant frequency of said oscillator, thereby to change the tuning of said receiver;

c. a channel position detector coupled to said tuner and including an encoder for generating a digital channel position signal corresponding to the channel position;

d. a digital clock including a register for storing the digital time signal generated by said clock;

e. a plurality of time memories, one for each channel to be selected, each time memory storing a particular selected time signal;

f. a plurality of channel memories, each being associated with one of said time memories, and each channel memory storing a selected channel signal representative of a particular channel;

g. a plurality of digital time comparators, each being coupled to said register and to one of said time memories for generating a digital time coincidence signal indicative of time coincidence between said digital time signal and said selected time signal;

h. a channel steering network coupled to said time comparator and said channel memories for passing upon occurrence of said time coincidence signal the selected channel signal to an output terminal;

i. a channel comparator coupled to the output terminal of said channel steering network for generating an output signal; and j. said channel comparator being also coupled to said encoder and to said tuner for generating an output error signal when said selected channel signal and said channel position signal do not coincide to cause said tuner to vary said oscillator until said error signal vanishes, whereupon said tuner is disabled and said output signal is generated.

6. The combination defined in claim 5 wherein a latch is coupled between said time comparator and said channel steering network, said latch having a set input terminal coupled to said time comparator, and a reset terminal, said reset terminal being coupled to the output terminal of said channel comparator, whereby said latch is reset in response to the channel comparator output signal.

7. The combination defined in claim 5 wherein a time entry switch for generating a selected time entry signal is coupled to each of said time memories and wherein a channel entry switch for generating a selected channel entry signal is coupled to each of said channel memories, and means coupled to each of said time memories and each of said channel memories for enabling one of said time memories and an associated one of said channel memories to enter the time entry signal and the channel entry signal respectively.

8. The combination defined in claim 7 wherein a time and channel enable network is connected to each of said time memories and to each of said channel memories for generating time and channel enable signals and channel memories and for loading the time and channel enable signals into said channel memories in predetermined sequence.

* * * * *